(12) United States Patent
Hill et al.

(10) Patent No.: US 6,601,226 B1
(45) Date of Patent: Jul. 29, 2003

(54) TIGHTLOOP METHOD OF TIMING DRIVEN PLACEMENT

(75) Inventors: Dwight Hill, San Carlos, CA (US); Satish Raj, Saratoga, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 09/524,772

(22) Filed: Mar. 14, 2000

(51) Int. Cl.$^7$ ............................................... G06F 17/50
(52) U.S. Cl. ....................................................... 716/10
(58) Field of Search ............................. 713/503; 716/7, 716/9, 10, 16, 1, 2, 6, 8, 11, 5

(56) References Cited

U.S. PATENT DOCUMENTS

| | | | | |
|---|---|---|---|---|
| 5,218,551 A | * | 6/1993 | Agrawal et al. | 716/10 |
| 5,475,607 A | * | 12/1995 | Apte et al. | 716/10 |
| 5,521,837 A | * | 5/1996 | Frankle et al. | 716/10 |
| 5,654,898 A | * | 8/1997 | Roetcisoender et al. | 716/9 |
| 5,659,484 A | * | 8/1997 | Bennett et al. | 716/16 |
| 5,666,290 A | * | 9/1997 | Li et al. | 364/491 |
| 5,778,216 A | * | 7/1998 | Venkatesh | 713/503 |
| 5,815,406 A | * | 9/1998 | Golla et al. | 716/7 |
| 6,230,304 B1 | * | 5/2001 | Groeneveld et al. | 716/7 |
| 6,233,722 B1 | * | 5/2001 | LaBerge | 716/10 |
| 6,301,693 B1 | * | 10/2001 | Naylor et al. | 716/10 |
| 6,415,425 B1 | * | 7/2002 | Chaudhary et al. | 716/9 |

OTHER PUBLICATIONS

Kleinhaus et al., "Gordian", IEEE Trans CAD, vol. 21, pp. 133–136, Mar. 1991.*

Donath et al., "Driven Placement Using Complet Path Delays," Proceedings of the 27$^{th}$ Design Automation Conference, 1990, pp. 84–89.*

* cited by examiner

*Primary Examiner*—Leigh M. Garbowski
(74) *Attorney, Agent, or Firm*—Bever, Hoffman & Harms, LLP; Jeanette S. Harms

(57) ABSTRACT

A tightloop method of timing driven placement. The present invention interleaves timing analyses and updates net weight based on the timing analyses as part of the cell location refinement processes of a placement algorithm. Thereby, the placement algorithm is augmented to factor in timing information such that the final placement is effective from overlap, net length, and timing perspectives.

41 Claims, 4 Drawing Sheets

TIGHTLOOP METHOD OF TIMING DRIVEN PLACEMENT

FIELD OF THE INVENTION

The present invention relates to the field of electronic design automation (EDA). More specifically, the present invention relates to a method for the tightloop timing driven placement of cells used in the design and fabrication of integrated circuit devices.

BACKGROUND OF THE INVENTION

The rapid growth in the complexity of modem electronic circuits has forced electronic circuit designers to rely upon computer programs to assist or automate most steps of the design process. Such a design is much too large for a circuit designer or even an engineering team of designers to manage effectively manually. Hence, circuits are almost always designed with the aid of an electronic design automation (EDA) system. Basically, an EDA system is a computer software system used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation. A netlist describes the IC design and is composed of nodes (elements) and edges (e.g., connections between nodes) and can be represented using a directed graph structure having nodes which are connected to each other with signal lines. A single node can have multiple fan-ins and multiple fan-outs. The netlist is typically stored in computer readable media within the EDA system and processed and verified using many well known techniques. One result is a physical device layout in mask form which can be used to directly implement structures in silicon to realize the physical IC device.

The process used to automate the design of electronic circuits entails first producing a high-level description of the circuit in a hardware description language such as Verilog or VHDL. Next, this high-level description is converted into a netlist using a computer implemented synthesis process, such as a the "Design Compiler" by Synopsys of Mountain View, Calif. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. Determining this geometric information is the function of an automatic placement process and an automatic routing process, both of which are typically computer programs.

Next, the designer supplies the netlist into the computer implemented automatic cell placement process. Placement in a VLSI design is the task of assigning X,Y positions to a set of cells, typically a numbering in the tens of thousands or more, such that they do not overlap each other, and that it is possible to route wires among their pins. Overlap is an absolute constraint and it can be determined immediately by inspecting the design; no cell can overlap another or the chip will not work. Thereupon, the designer supplies the netlist and the cell location data structure, generated by the placement program, to a computer implemented automatic wire routing process. This computer program generates wire geometry within data structure. The wire geometry data structure and cell placement data structure together are used to make the final geometric database needed for fabrication of the circuit.

The placement process can yield any number of different, unique solutions. Some of the placement solutions are better than other solutions in terms of timing. Timing is becoming ever more critical because it affects the speed at which a chip can operate. Faster chips can be sold at a premium price. Indeed, some designs are so timing critical that even though a certain placement solution is found, that particular placement might not meet certain timing specifications. As a result, it is important to consider timing constraints when placing cells.

The goal then is to how best to augment the placement algorithm to produce a placement that has good timing characteristics. First, it is necessary to provide some background on timing driven placement (TDP). Any placement of cells results in some nets that are long, and others that are short. In the standard metric, only the total length of nets is counted, so it does not particularly matter which nets are long and which are short. But to achieve high timing performance, it is important that timing critical nets are short, and it is fine if nets that are not timing critical are longer, as long as the total wirelength is not unreasonable. The "classic" approach to timing driven placement starts by doing a timing analysis on the circuit before placement. The timing results are analyzed, and a set of critical nets is identified. These nets are then given high "weights", and placement runs in such a way as to minimize the weighted sum of net lengths. This classic approach can be used with either slicing or non-slicing placers.

One problem with the "classic" approach is that the placement itself can greatly influence the timing analysis. Hence, the analysis and weights obtained at the beginning of placement can be irrelevant, or even counterproductive toward the end of placement. Note that only the X,Y positions at the end of placement have any value; all intermediate results are discarded. Before proceeding, it is worthwhile to consider the question: how was it possible that "classic" ever worked? After all, if net capacitances change radically with placement, it would seem impossible that the net weights at the beginning could be accurate enough to have value. Net weights are only valuable if the timing analysis used to generate them is accurate, and timing analysis is inaccurate if the capacitance estimates that drive it are inaccurate. Capacitance estimates are determined directly by X,Y coordinates of cells, so error in the X,Y coordinates results in errors in the capacitance estimates which results in errors in the timing analysis which results in errors in the weights. In fact, the "classic" approach does work on some circuits, but does poorly on others. This is probably because in some circuits there are many usable placement solutions with different placements and different net delays, but with overall good wirelength and timing. In such circuits, at least one solution exists where the set of net weights at the end was close to the set predicted by wireload models. (e.g., paths with many stages tend to be critical).

Thus, there exists a need in the prior art for a method which optimizes the placement of cells from a timing driven perspective. The present invention provides a unique, novel solution by implementing a tightloop method of timing driven placement.

SUMMARY OF THE INVENTION

The present invention pertains to a tightloop method of timing driven placement. Basically, the present invention interleaves timing analyses and updates net weights based on the timing analyses as part of the cell location refinement processes of a placement algorithm. In a placement algorithm, the placement of cells are successively refined until a final placement solution is achieved. The cell locations are moved during each refinement pass based on certain weighting factors. Rather than running a single timing analysis just at the beginning to identify critical nets and assigning a high weight to the critical nets, the present invention recognizes that the timing characteristics change each time a cell is moved. Consequently, a new timing analysis is performed for each pass. Based on the timing analysis, the weighting for the nets is altered accordingly. This weighting affects the way by which cell locations are modified in successive passes. Thereby, the placement algorithm is augmented to factor in timing information such that the final placement is effective from timing perspectives as well as overlap and wire length perspectives.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A tightloop method of timing driven placement is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
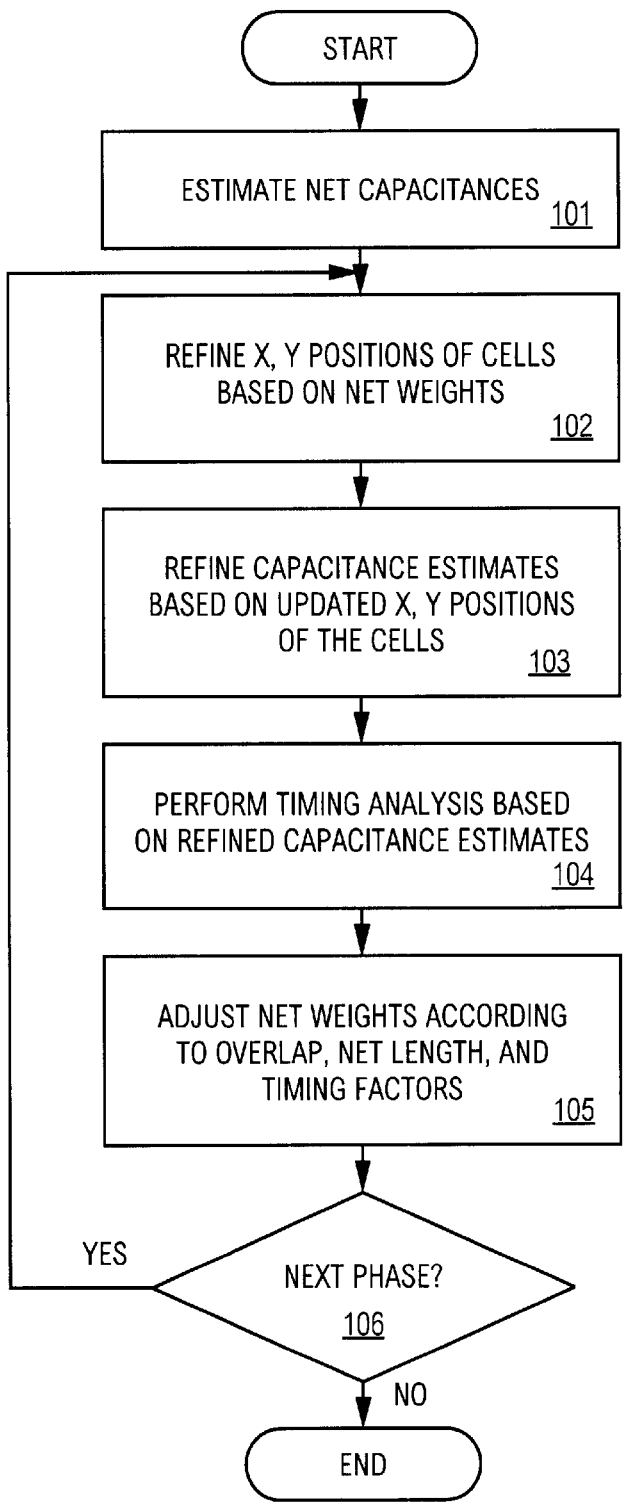
FIG. 1 shows a flowchart describing the steps for performing a tightloop method of timing driven placement.

The present invention augments a placement algorithm to include timing information, such that the final placement is effective from overlap, net length, and timing perspectives. In the currently preferred embodiment of the present invention, the method starts with net capacitances estimated by some independent method such as a wireload model. Note that starting with net caps==0 is unlikely to produce as good an estimate as even a simple wireload model. The method then proceeds to iteratively refine the X,Y positions of cells, while simultaneously refining capacitance estimates and timing weights. Referring to FIG. 1, a flowchart describing the steps for performing a tightloop method of timing driven placement is shown. Initially, the net capacitances are estimated, step 101. Next, the X,Y positions of the cells are refined in a first placement refinement phase, step 102. The cell positions are refined according to updated net weights. Thereupon, new estimates for the capacitance are calculated based on the updated cell positions, step 103. A timing analysis is then executed based on the refined capacitance estimates, step 104. The net weights are then adjusted according to the timing as well as other factors, such as overlap, net length, etc., step 105. These steps 102–105 are repeated until all refinement phases have been executed, step 106. That is, if there are, for example, seven phases of refinement in the placement algorithm, there would be seven timing analysis/net weight updates in the timing driven version of the placement algorithm. At each stage, the estimate of the capacitance of a net is done based on the current X,Y position, perhaps augmented by information about the history of that net in previous phases. Thereby, the timing analysis and net weight updates are essentially interleaved with the location refinement phases of a placement algorithm.

In the currently preferred embodiment, the tightloop method of timing driven placement can utilize the phases inherent in both slicing and non-slicing placement methods. In other words, the present invention is adapted to operate with either a slicing placement algorithm, or a phase-based, non-slicing placement algorithm. Conventionally, the placement problem has been addressed with "slicing" and "non-slicing" methods. Slicing methods work by dividing the set of cells into smaller groups, and assigning those groups into sub-regions on the die. In each phase in a slicing placement, the location of a cell is restricted to a smaller region than in the previous phase. Typically, the regions are divided roughly in half. So after the first phase of placement, a cell's X,Y location would be restricted to, say, the right half of the die. After the second phase, it might be restricted to the upper-right quadrant, etc. Slicing methods have been employed for many years, as described by Dunlop et. al. in IEEE Trans CAD, pp 92–98, January 1985. Some of them employ mathematical optimization techniques such as quadratic or conjugate gradient searches to help guide the decision of which region to place cells. One such system is called "GORDIAN" by Kleinhans, et. al in IEEE Trans CAD, vol 21, pp 133–136, March 1991. Slicing placers inherently eliminate overlap by assigning cells to non-overlapping regions of the original die. Note that any valid assignment, where the area of the cells is less than or equal to the area of the subregions will eliminate overlap. Slicing placers try to minimize the predicted wirelength by trying to choose assignments where the number of wires crossing the among the subregions is minimized. This is called the "cutsize" metric, and while less accurate than the Steiner or even the Half Perimeter metrics, it does generally tend to correlate with wirelength.

In non-slicing methods, all the cells are assigned positions simultaneously. An example is described by Eisenmann et. al., Proceedings of Design Automation Conference, 1998, pp 269–274. In such a system, cells do not move in only one step from their initial position to their final position. Rather, they move repeatedly. The new positions are based on each cell's current position, and the position of cells connected to it or near to it. Having many cells near to it tends to cause overlap, so the at each iteration of the algorithm there is a function built into the system to move cells apart to avoid this. Being connected to other cells a long distance away means higher routing costs, and so each iteration tries to bring connected cells together. The effectiveness of non-slicing algorithms is largely determined by how well they balance these two contradictory forces.

Non-slicing mechanisms, especially the "globalplace" mechanism, tend to have a sequence of steps that trade off costs with a progression of priorities. Early in the placement process, overlap is not as important as wirelength. Late in the process, overlap costs become critical. In the globalplace technique, placement is performed in several phases, typically 5 to 10. In each phase, the overlap cost of cells is measured by breaking the surface of the die into bins, and then counting the cells within each bin. Just as in the case of slicing placement, the exact position of the cells inside the bins is not important. As placement proceeds, the size of the bins are reduced, and with it, the uncertainty about the position of cells. So, as in the case of slicing placement, only an approximate X,Y position for each cell is known early on, but a more precise position is known at each phase.

If this "tightloop" method is used with a non-slicing mechanism, the X,Y coordinates of the cells can be used directly as estimates of their position during the phase. If this "tightloop" method is used with a slicing-placement mechanism, then an X,Y coordinate based on the region that the cell is assigned to can be used. The cell could be assigned to a random position within the subregion, and this coordinate used for estimating capacitances.

It should be noted that since "routability" is quite difficult to determine without actually routing the circuit, a common approach is to substitute a simpler metric. One such metric is the total wire length of the wires that would be needed to connect the cells. This is known as "total wirelength". Good placements have a lower total predicted wirelength than poor placements. The wirelength implied by a placement can be predicted without actually doing the routing. There are several techniques for doing this, but the most common ones achieve their speed because they consider each net in isolation, without considering the interference of one net with the others. The simplest method is to just find the bounding box of all the points to be routed, and take half of its perimeter. This so-called "half-perimeter" metric is the cost metric used in the inner loop of most placement algorithms. A more sophisticated method is to compute a rectilinear steiner tree of all the points to be routed. Note that a placement that is good by the bounding box metric will tend to be good with the Steiner metric, but that it is easy to find counterexamples. In the currently preferred embodiment of the present invention, placement techniques are discussed that eliminate overlap and attempt to reduce wirelength by the half-perimeter metric above. However, more sophisticated wirelength metrics could also be employed.

Figure 2:
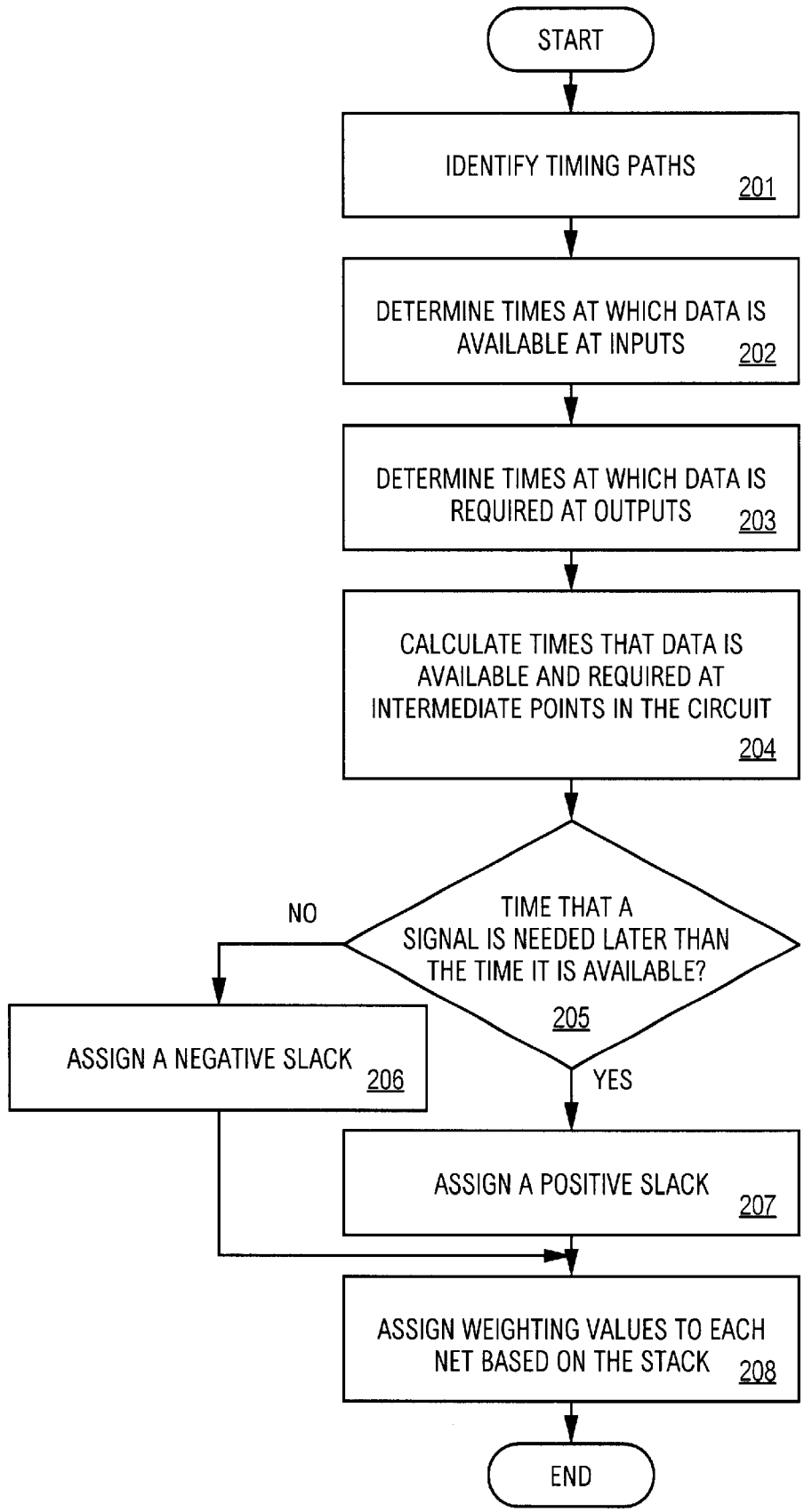
FIG. 2 is a flowchart describing the steps for performing an exemplary timing analysis as it pertains to the present invention.

As stated above, the tightloop method of timing driven placement of the present invention involves interleaving timing analysis/net weight updates with the location refinement phases in the placement algorithm. The process of turning a timing analysis into a set of critical nets can be fairly complex. FIG. 2 is a flowchart describing the steps for performing an exemplary timing analysis. Timing analysis works by identifying timing paths, which start at inputs and run through a series of gates to outputs, step 201. Each path is comprised of many nets. Given the times at which data is available at the inputs to the circuit, and the times at which data is required at the outputs of the circuit, timing analysis process finds times that data is available and required at intermediate points in the circuit, steps 202–204. A calculation is then performed to determine whether the time that a signal is needed later than the time by which it is available, step 205. If the time a signal is needed is earlier than the time it is available the signal is said to have negative slack, step 206. If the time a signal is needed is later than the time it is available the signal is said to have positive slack, step 207. The weighting values are then assigned to each net as a function of the slack, step 208.

Net weight generation works by examining these arrival and required times, and assigns positive numeric values to each net based on the slack. Nets that have low, or negative slack are given high weights, and are therefore likely to influence placement more. Nets with large slacks are not timing critical, and so are given low weights. In a practical placement system only a limited percentage of the nets are typically given high weights. If a majority of the nets, were given high weights, the relative influence of the weights would be diminished.

In another embodiment, the tightloop method can be used with the following estimated capacitance for slicing placers:

eff bbox of net=current bbox*alpha, where alpha is a heuristic factor that depends on the bbox's of the regions containing each of the cells on the net and the number of pins on the net.

Timing analysis operates on these capacitance estimates, which are more accurate than the single point estimate provided by "classic" approaches. But the timing analysis is still reasonably efficient, since the total computation spent in timing analysis is much less than the time to run separate timing analyses multiple times. This is because only the first timing analysis has to do the work of constructing the timing graph and initializing all the data. Subsequent timing analysis operations can be based on simple timing updates, which operate much faster.

It should be noted that any point in placement the X,Y position of a cell is only a predictor of the final X,Y position. Successive movements on successive placement phases produce new proposed X,Y coordinates. At the end of each phase, each cell's X,Y is a new "raw" predictor of net capacitance. A "best fit" predictor would be to average the last N "raw" predictors for net weights. Such a "best fit" predictor would dampen out the noise caused by cell movements but retains the general value. One quick and easy way to do a "best fit" estimate based on a series of "raw" estimates is to use a dampened average, as shown below in the first formula [1]:

$$\text{new\_estimate} = W * \text{current\_data} + (1.0 - W) * \text{previous\_estimate}$$

Note that if the W=1.0, there is no dampening, and if the W=0.0, this results in the "classic" method.

The net weights generated at each phase are increasingly accurate and effective. This is especially true if the net weights are dampened by averaging the currently calculated net weights and the previous net weight for each net. When this is done, errors in the net weights caused by random variations in placement tend to average out. Furthermore, dampening can be accomplished with a formula similar to the one above, but revised to work on weights as shown below in the second formula [2]:

$$\text{new\_effective\_weight} = W * \text{current\_weight} + (1.0 - W) * \text{previous\_weight}.$$

Figure 3:
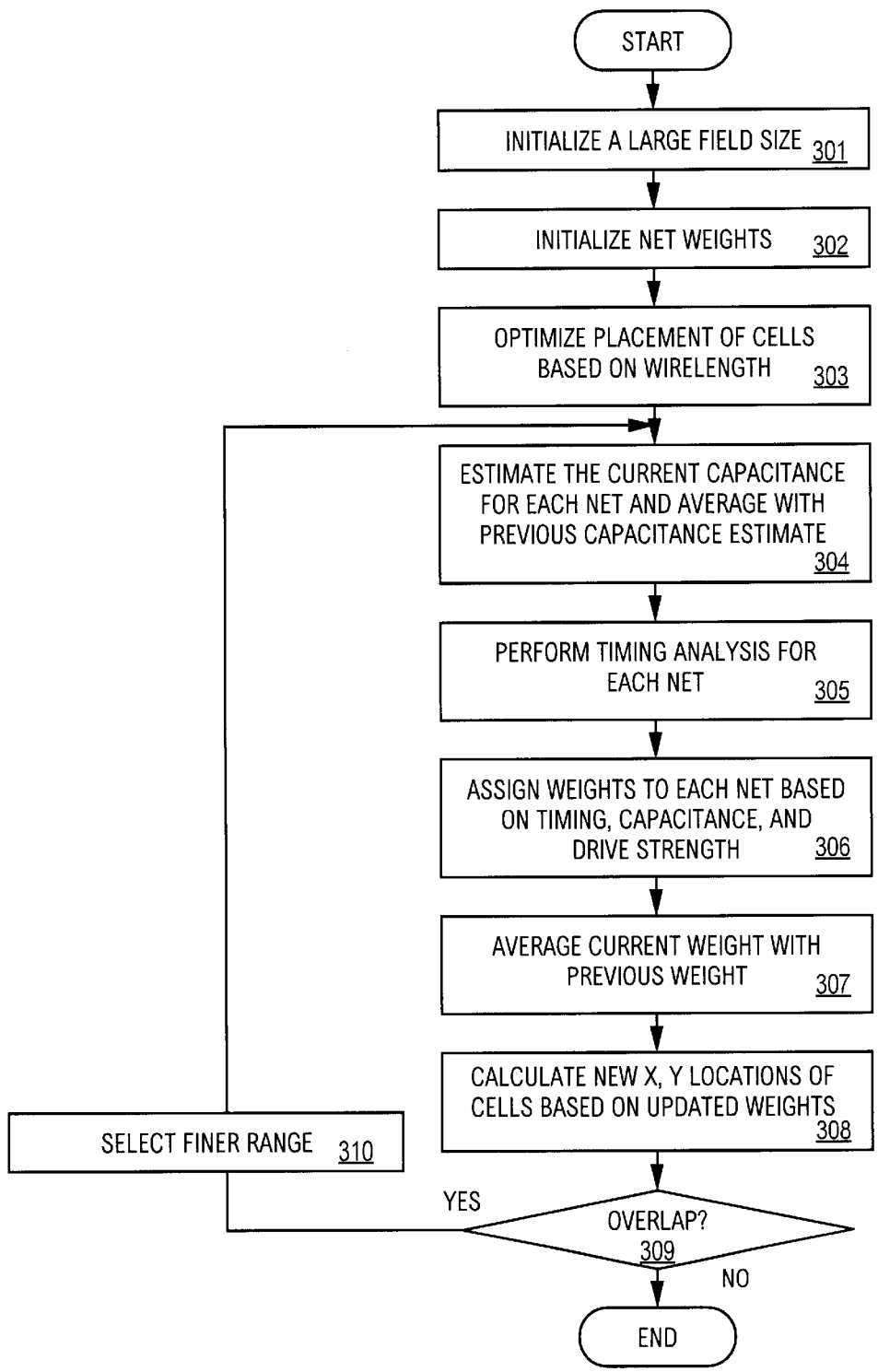
FIG. 3 is a flowchart which describes in detail the steps for performing the currently preferred embodiment of the present invention of the tightloop method of timing driven placement.

FIG. 3 is a flowchart which describes in detail the steps for performing the currently preferred embodiment of the present invention of the tightloop method of timing driven placement. Start with a large field size or large region, step 301. No weights are communicated to placer in the first major pass of placement. All net weights are initialized to 1, step 302. Using wirelength approximate to compute net weights may tend to negatively impact the placement further downstream. Instead, the first pass optimizes based essentially on wirelength, step 303. Net weights are generated from the second pass using the X,Y values at the end of the first pass. Thereupon, steps 304–308 are repeated for each placement place phase (e.g., approximately seven phases). First, estimate the current raw capacitance for each net, and average it into the previous cap estimate using the first formula [1] given above, step 304. A reasonable W might be 0.3. Next, perform timing analysis to determine the slack on each net, step 305. Then, assign weights to each net based on its slack, capacitance and drive strength, step 306. Next, average the currently calculated weight with the previous value using a second formula like [2] given above, step 307. A reasonable W might be 0.5. Lastly, refine the placement using analytical or other techniques, to arrive at new X,Y coordinate estimates for cells and minimize estimated weighted sum of wire lengths, step 308. This will typically cut the uncertainty of a cells coordinate in half, or by some similar amount. If the grid is fine enough to determine that overlap is eliminated, stop, step 309. Otherwise, select a finer range size, step 310, and iterate back to step 304. It should be noted that since timing is not influence much by detailed movement, after the early phases of placement are done, the net cap estimates/and hence the net weights should be stable. Thus, it is unlikely that the weights will change much in the final few phases.

In an alternative embodiment, the net weights can be re-computed on alternate passes (e.g., 1, 3, 5, etc.). This reduces the number of times the timing analysis need be performed, thereby resulting in faster runtimes. The skipped passes (e.g., 2, 4, 6, etc.) use the netweights from prior passes (e.g., 1, 3, 5, etc.). The effect on the end result is small compared to the reduction in runtime.

In yet another embodiment, with respect to when the switch to a finer grid is to be performed, the system can optionally compare the current/previous capacitance estimates before switching to a finer grid. If the current wire capacitances, after a placement solution, are radically different from the estimates going into the placement pass, the system can update the wire capacitances using the dampened estimate in the second formula [2] and then run placement again with the current grid. This consumes more CPU time, but is more likely to improve the result, especially in the critical middle passes.

Figure 4:
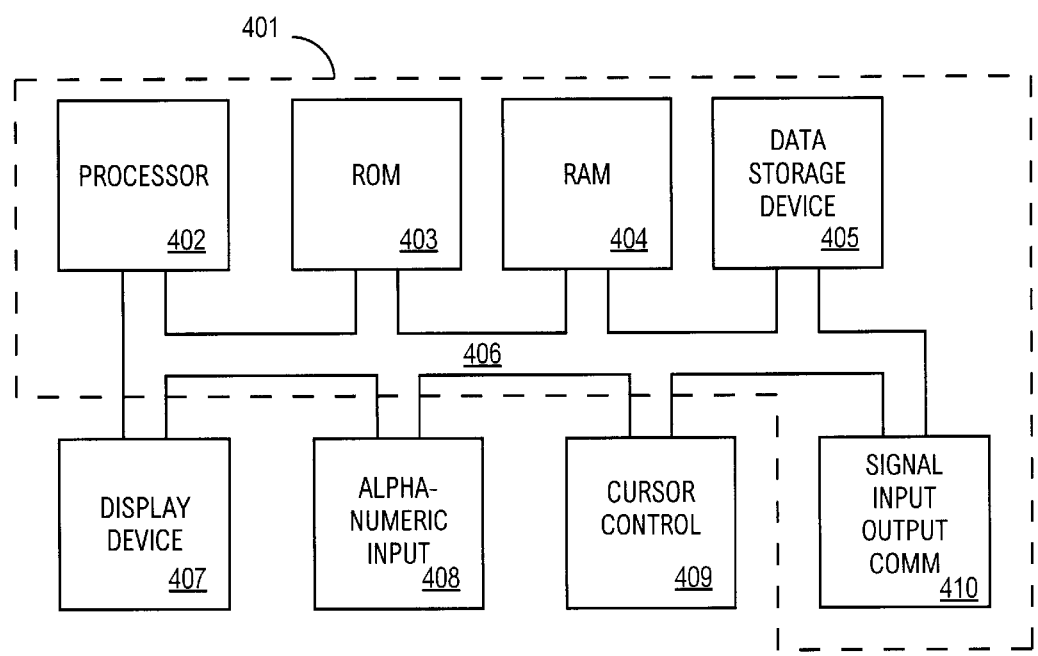
FIG. 4 shows an exemplary computer system upon which the present invention may be practiced.

Referring to FIG. 4, an exemplary computer system 401 upon which the present invention may be practiced is shown. The tightloop method of timing driven placement process is operable within computer system 401. When configured with the rough placement procedures of the present invention, system 401 becomes a computer aided design (CAD) tool for integrated circuit placement. The tightloop method of timing driven placement steps described in FIGS. 1 and 3 are implemented within system 4.

In general, computer systems 401 used by the preferred embodiment of the present invention comprise a bus 406 for communicating information, a central processor 402 coupled with the bus for processing information and instructions, a computer readable volatile memory 404 (e.g., random access memory) coupled with the bus 406 for storing information and instructions for the central processor 402. A computer readable read only memory 403 is also coupled with the bus 406 for storing static information and instructions for the processor 402. A data storage device 405 such as a magnetic or optical disk and disk drive coupled with the bus 406 is used for storing information and instructions. A display device 407 coupled to the bus 406 is used for displaying information to the computer user. And an alphanumeric input device 408 including alphanumeric and function keys is coupled to the bus 406 for communicating information and command selections to the central processor 402. A cursor control device 409 is coupled to the bus for communicating user input information and command selections to the central processor 402, and a signal generating device 410 is coupled to the bus 406 for interfacing communications. The display device 407 of FIG. 4 utilized with the computer system 401 of the present invention may be a liquid crystal device, cathode ray tube, or other display device suitable for creating graphic images and alphanumeric characters recognizable to the user. The cursor control device 409 allows the computer user to dynamically signal the two dimensional movement of a visible symbol (pointer) on a display screen of the display device 407.

It should be noted that there have also been several other systems in the prior art literature that do timing driven placement. Some of them use a separate timing analysis tool, but do not actually integrate the placement with the timing. However, to the best of our knowledge, none of them perform the capacitance or net weight dampening feature of tightloop. An example of the generation of net weights based on a specific fixed timing analysis is given in Tsay, Ren-Song, and Juergen Koehl, "An Analytic Net Weighting Approach for Performance Optimization in Circuit Placement," Proceedings of the 28th Design Automation Conference, 1991, pp. 620–625. This does not contain the looping principle in tightloop. Another way of doing timing driven placement is to place one cell in the best position from a timing perspective, then the next cell in the best position that is available, then the next cell, etc. This process is described in Sutanthanivibul, Suphachai, and Eugene Shragowitz, "An Adaptive Timing-Driven Layout for High Speed VLSI," Proceedings of the 27th Design Automation Conference, 1990, pp. 90–95. This also does not contain the looping principle, and does not consider all the cells simultaneously, as is practiced in the present invention. A system which does contain a looping principle is Donath, Wilm, R. Norman, et al., "Timing Driven Placement Using Complete Path Delays," Proceedings of the 27th Design Automation Conference, 1990, pp. 84–89. However, the estimates for net capacitance are not dampened. Similarly, the article Jackson, Michael and E. Kuh, "Performance Driven Placement of Cell Based IC's Proceedings of the 26th Design Automation Conference," 1989, pp. 370–375, describes placement, where the XY position of cells, and their timing weights are optimized simultaneously in a linear program. It does not actually "loop" with a timing analyzer, and does not dampen the capacitance estimates.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of placing cells for an integrated circuit design, comprising the steps of:
   a) initially placing cells at particular locations;
   b) estimating a plurality of capacitances associated with a plurality of nets corresponding to the current x-y position of cell placements;
   c) performing a timing analysis based on the plurality of capacitances;

d) determining a plurality of net weights as a function of the timing analysis, an overlap, and a net length;

e) determining a plurality of dampened net weights, wherein each dampened net weight is equal to a corresponding one of the plurality of net weights multiplied by a first weight factor, plus a corresponding previous one of the plurality of dampened net weights multiplied by one minus the first weight factor;

f) changing the cell placements according to the plurality of dampened net weights; and g) repeating one or more of the steps b–f iteratively a plurality of times.

2. The method of claim 1, wherein steps b–f are performed as a phase in a slicing placement method.

3. The method of claim 1, wherein steps b–f are performed as a phase in a non-slicing placement method.

4. The method of claim 1, wherein the step of performing the timing analysis is comprised of the steps of:

determining a time at which data is available at an input of a path;

determining a time at which data is required at an output of the path;

calculating a set of times that data is available at a plurality of nets along the path;

calculating a set of times that data is required at the plurality of nets along the path; and determining a plurality of slacks as a function of the set of times that data is available and the set of times that data is required.

5. The method of claim 1, wherein step c further comprises:

determining a plurality of dampened capacitances, wherein each dampened capacitance is equal to a corresponding one of the plurality of capacitances multiplied by a second weight factor, plus a corresponding previous one of the plurality of capacitances multiplied by one minus the second weight factor; and performing a timing analysis based on the set of dampened capacitances.

6. The method of claim 1, further comprising repeating the steps of b–f and then repeating the steps of d–f iteratively a plurality of times.

7. A method for placing cells of a netlist which describes a circuit to be fabricated on a semiconductor chip, comprising the steps of:

performing a first placement of the cells;

executing a first timing analysis based on the first placement of the cells;

determining a first set of net weights according to the first timing analysis;

performing a second placement of the cells as a function of the first set of net weights;

executing a second timing analysis based on the second placement of the cells;

determining a second set of net weights according to the second timing analysis;

determining a set of dampened net weights as a function of the first set of net weights and the second set of net weights; and performing a third placement of the cells as a function of the set of dampened net weights.

8. The method of claim 7 further comprising the steps of:

adjusting the first set of net weights as a function of a first set of overlaps; and adjusting the second set of net weights as a function of a second set of overlaps.

9. The method of claim 7 further comprising the steps of:

adjusting the first set of net weights as a function of a first set of net lengths; and adjusting the second set of net weights as a function of a second set of net lengths.

10. The method of claim 7, wherein the step of executing the first timing analysis is comprised of the steps of:

determining a time at which data is available at an input of a path based on the first placement of the cells;

determining a time at which data is required at an output of the path;

calculating a set of times that data is available at a plurality of nets along the path;

calculating a set of times that data is required at the plurality of nets along the path; and determining a plurality of slacks as a function of the set of times that data is available and the set of times that data is required.

11. The method of claim 7 further comprising the steps of:

adjusting the first set of net weights as a function of a first set of drive strengths; and adjusting the second set of net weights as a function of a second set of drive strengths.

12. A computer-readable medium having stored thereon instructions for causing a computer to implement a placement process, comprising the steps of:

a) initially placing cells at particular locations;

b) estimating a plurality of capacitances associated with a plurality of nets corresponding to the current x-y position of cell placements;

c) performing a timing analysis based on the plurality of capacitances;

d) determining a plurality of net weights as a function of the timing analysis, an overlap, a drive strength, and a net length;

e) determining a plurality of dampened net weights as a function plurality of net weights and a previous plurality of dampened net weights;

f) changing the cell placements according to the plurality of dampened net weights; and g) repeating one or more of the steps b–e as iterative phases a plurality of times.

13. The computer-readable medium of claim 12, wherein steps b–f are performed as a phase in a slicing placement method.

14. The computer-readable medium of claim 12, wherein steps b–f bare performed as a phase in a non-slicing placement method.

15. The computer-readable medium of claim 12, wherein the step of performing the timing analysis is comprised of the steps of:

determining times at which data is available at an input of a path;

determining times at which data is required at an outputs of the path;

calculating a set of times that data is available at a plurality of nets along the path;

calculating a set of times that data is required at the plurality of nets along the path; and determining a plurality of slacks as a function of the set of times that data is available and the set of times that data is required.

16. The computer-readable medium of claim 12, wherein step c further comprises:
   determining a plurality of dampened capacitances as a function of the plurality of capacitances and a previous plurality of dampened capacitances; and
   performing a timing analysis based on the plurality of dampened capacitances.

17. The computer-readable medium of claim 12, further comprising repeating the steps of b–f and then repeating steps d–f iteratively a plurality of times.

18. A method of placing cells for an integrated circuit design, comprising the steps of:
   a) initially placing cells at particular locations;
   b) estimating a plurality of capacitances associated with a plurality of nets corresponding to the current x-y position of cell placements;
   c) determining a plurality of dampened capacitances, wherein each dampened capacitance is equal to a corresponding one of the plurality of capacitances multiplied by a second weight factor, plus a corresponding previous one of the plurality of capacitances multiplied by one minus the second weight factor;
   d) performing a timing analysis based on the plurality of dampened capacitances;
   e) determining a plurality of net weights as a function of the timing analysis, an overlap, and a net length;
   f) changing the cell placements according to the plurality of net weights; and
   g) repeating one or more of the steps b–f iteratively a plurality of times.

19. The method of claim 18, wherein step f further comprises:
   determining a plurality of dampened net weights, wherein each dampened net weight is equal to a corresponding one of the plurality of net weights multiplied by a first weight factor, plus a corresponding previous one of the plurality of net weights multiplied by one minus the first weight factor; and
   changing the cell placements according to the plurality of dampened net weights.

20. The method of claim 17, wherein steps b–f are performed as a phase in a slicing placement method.

21. The method of claim 17, wherein steps b–f are performed as a phase in a non-slicing placement method.

22. The method of claim 18, wherein the step of performing the timing analysis is comprised of the steps of:
   determining a time at which data is available at an input of a path;
   determining a time at which data is required at an output of the path;
   calculating a set of times that data is available at a plurality of nets along the path;
   calculating a set of times that data is required at the plurality of nets along the path; and
   A determining a plurality of slacks as a function of the set of times that data is available and the set of times that data is required.

23. The method of claim 18, further comprising repeating the steps b–f and then repeating the steps of d-f iteratively a plurality of times.

24. A method for placing cells of a netlist which describes a circuit to be fabricated on a semiconductor chip, comprising:
   performing a first set of phases; and
   performing a second set of phases comprising:
      estimating a current set of capacitances based on a previous placement of the cells;
      determining a current set of dampened capacitances as a function of the current set of capacitances and a previous set of dampened capacitances;
      executing a current timing analysis based on the current set of dampened capacitances and the previous placement of the cells;
      determining a current set of net weights according to the current timing analysis;
      determining a current set of dampened net weights as a function of the current set of net weights and a previous set of dampened net weights; and
      performing a current placement of the cells as a function of the current set of dampened net weights.

25. The method of claim 24, wherein determining the current set of net weights is further determined according to a current set of overlaps.

26. The method of claim 24, wherein determining the current set of net weights is further determined according to a current set of net lengths.

27. The method of claim 24, wherein determining the current set of net weights is further determined according to a current set of drive strengths.

28. The method according to claim 24, further comprising: performing a third set of phases comprising:
   determining the current set of net weights according to the current set of overlaps;
   performing the current placement of the cells as a function of the current set of net weights.

29. The method of claim 28, wherein determining the current set of net weights is further determined according to a current set of net lengths.

30. The method of claim 28, wherein determining the current set of net weights is further determined according to a current set of drive strengths.

31. The method according to claim 24, further comprising: performing a third set of phases comprising:
   determining the current set of net weights according to the current set of overlaps;
   determining a current set of dampened net weights as a function of the current set of net weights and a previous set of dampened net weights; and
   performing a current placement of the cells as a function of the current set of dampened net weights.

32. The method of claim 31, wherein determining the current set of net weights is further determined according to a current set of net lengths.

33. The method of claim 31, wherein determining the current set of net weights is further determined according to a current set of drive strengths.

34. The method according to claim 24, wherein performing a first set of phases comprises:
   performing an initial placement of the cells;
   estimating a first set of capacitances based on the initial placement of the cells;
   executing a first timing analysis based on the first set of capacitances and the initial placement of the cells;

determining a first set of net weights according to the first timing analysis; and performing a first placement of the cells a function of the first set of net weights.

35. The method of claim 34, wherein determining the current set of net weights is further determined according to a current set of overlaps.

36. The method of claim 34, wherein determining the current set of net weights is further determined according to a current set of net lengths.

37. The method of claim 34, wherein determining the current set of net weights is further determined according to a current set of drive strengths.

38. A computer-readable medium having stored thereon instructions for causing a computer to implement a placement process, comprising:

estimating a current set of capacitances based on a previous placement of the cells;

determining a current set of dampened capacitances as a function of the current set of capacitances and a previous set of capacitances;

executing a current timing analysis based on the current set of dampened capacitances and the previous placement of the cells;

determining a current set of net weights according to the current timing analysis;

determining a current set of dampened net weights as a function of the current set of net weights and a previous set of net weights; and performing a current placement of the cells as a function of the current set of dampened net weights.

39. The computer-readable medium of claim 38, wherein determining the current set of net weights is further determined according to a current set of overlaps.

40. The computer-readable medium of claim 38, wherein determining the current set of net weights is further determined according to a current set of net lengths.

41. The computer-readable medium of claim 38, wherein determining the current set of net weights is further determined according to a current set of drive strengths.

* * * * *